(12) United States Patent
Hung

(10) Patent No.: US 10,098,230 B2
(45) Date of Patent: Oct. 9, 2018

(54) MEMORY MODULE AND METHOD OF MANUFACTURING THE MEMORY MODULE

(71) Applicant: V-COLOR TECHNOLOGY INC., New Taipei (TW)

(72) Inventor: Con-Ning Hung, New Taipei (TW)

(73) Assignee: V-COLOR TECHNOLOGY INC., New Taipei (TW)

(*) Notice: Subject to any disclaimer, the term of this patent is extended or adjusted under 35 U.S.C. 154(b) by 403 days.

(21) Appl. No.: 15/090,294

(22) Filed: Apr. 4, 2016

(65) Prior Publication Data

US 2017/0202086 A1 Jul. 13, 2017

(30) Foreign Application Priority Data

Jan. 11, 2016 (TW) .............................. 105100705 A

(51) Int. Cl.
G08B 5/36 (2006.01)
H05K 1/18 (2006.01)
H05K 1/02 (2006.01)
H05K 1/11 (2006.01)
H05K 1/09 (2006.01)

(52) U.S. Cl.
CPC ........... *H05K 1/181* (2013.01); *H05K 1/0274* (2013.01); *H05K 1/09* (2013.01); *H05K 1/117* (2013.01); *H05K 2201/0108* (2013.01); *H05K 2201/09063* (2013.01); *H05K 2201/09145* (2013.01); *H05K 2201/10106* (2013.01); *H05K 2201/10159* (2013.01); *Y02P 70/611* (2015.11)

(58) Field of Classification Search
CPC ......... H05K 1/181; H05K 1/0274; H05K 3/06
USPC ....... 340/815.55, 686.1; 361/679.31, 679.46; 365/149, 150, 191
See application file for complete search history.

(56) References Cited

U.S. PATENT DOCUMENTS 6,242,298 B1* 6/2001 Kawakubo ........ H01L 21/31691
257/E21.009
2012/0268885 A1* 10/2012 Feng ........................ G06F 1/185
361/679.31

FOREIGN PATENT DOCUMENTS

TW M508053 9/2015

* cited by examiner

*Primary Examiner* — Tai T Nguyen
(74) *Attorney, Agent, or Firm* — Muncy, Geissler, Olds & Lowe, P.C.

(57) ABSTRACT

A memory module and a method of manufacturing the same are disclosed. The memory module includes a substrate, at least one memory, a mask film and at least one light emitting diode. The substrate includes electrical circuit and golden fingers, and a notch is provided at the upper rim of the substrate. The mask film is formed of opaque copper foil, and has a notch and at least one hole close to the upper rim of the substrate. The light emitting diodes are configured on the substrate and connected to the electrical connection circuit, and each light emitting diode is provided at the corresponding hole of the mask film. Thus, light generated by the light emitting diodes passes through the hole and travels outwards along the upper rim of the substrate to form a specific bright pattern, text or strip, thereby enhancing a sense of vision.

10 Claims, 3 Drawing Sheets

MEMORY MODULE AND METHOD OF MANUFACTURING THE MEMORY MODULE

CROSS-REFERENCE TO RELATED APPLICATION

This application claims the priority of Taiwanese patent application No. 105100705, filed on Jan. 11, 2016, which is incorporated herewith by reference.

BACKGROUND OF THE INVENTION

1. Field of the Invention

The present invention generally relates to a memory module and method of manufacturing the same, and more specifically to a memory module and method of manufacturing the same, in which an opaque mask film with holes or hollow marks is attached onto a substrate, light emitting diodes are provided at the holes, light generated by the light emitting diodes passes through the hole and travels outwards along the upper rim of the substrate to form a specific bright pattern, text or strip so as to exhibit variation of brightness for the overall memory module and greatly enhance a sense of vision.

2. The Prior Arts

In the industry of printed circuit board and electronics, the commonly used circuit module generally comprises a circuit substrate and circuit devices on the circuit substrate. The circuit device are connected to an electrical lead via conductive circuit connections, and light emitting diodes (LEDs) are provided on the conductive circuit connections such that brightness level of the LEDs changes in a manner the conductive circuit connections are switched to turning on or off, so as to indicate or display the current operation state of the circuit module. However, light generated by the LEDs is possibly and directly incident onto human eyes to cause the viewer to feel dizzy or uncomfortable without any mask or protective shield.

To solve the above problem, Taiwan patent No. M508053 taught a circuit module comprising a substrate, at least one light emitting diode (LED) and at least one translucent light guide. The substrate is provided with a PCI-E lead for electrically inserting into a PCI-E slot. The LED is provided on the substrate and specifically at the same side as the PCI-E lead, and electrically connected to the PCI-E lead. In particular, the LED is at least partially covered by the light guide and light emitted by the LED is guided through the light guide due to the effect of refraction and absorption so as to generate a smoother and more uniform emitting light. Thus, human eyes are prevented from damage due to directly watching the original emitted light of the LED.

However, one shortcoming in the prior arts is that the circuit module needs to provide with the light guide having a particular structure, and the overall structure of the circuit module becomes more complicated, it is adverse for design, production and assembly. As a result, the cost of material increases due to the light guide to greatly affect industrial utility and hard to further expand popularity in the market.

Therefore, it is greatly needed to provide a new a memory module and method of manufacturing the same for providing a mask feature in a simple manner, in which an opaque mask film with holes or hollow marks is attached onto a substrate having a V-shape notch, light emitting diodes are provided at the holes, light generated by the light emitting diodes passes through the hole or is incident onto hollow marks to show a specific bright pattern, text or strip and exhibit variation of brightness for the overall memory module, thereby greatly enhance a sense of vision and overcoming the above problems in the prior arts.

Therefore, it is greatly needed to provide a new a memory module and method of manufacturing the same for providing a mask feature in a simple manner, in which an opaque mask film with holes or hollow marks is attached onto a substrate having a V-shape notch, light emitting diodes are provided at the holes, light generated by the light emitting diodes passes through the hole or is incident onto hollow marks to show a specific bright pattern, text or strip and exhibit variation of brightness for the overall memory module, thereby greatly enhance a sense of vision and overcoming the above problems in the prior arts.

SUMMARY OF THE INVENTION

The primary objective of the present invention is to provide a memory module, comprising a substrate, at least one memory, a mask film and at least one light emitting diode. The substrate is at least partially transparent, possesses electrical insulation and comprises electrical circuit. Specifically, a notch is provided at the upper rim of the substrate, and further, golden fingers are provided at the lower rim of the substrate and connected to the electrical circuit, wherein the golden fingers are configured to insert into the slot of the external device.

The mask film is opaque, preferably formed of copper foil by the etching process, and provided on the substrate and close to the upper rim. Also, the mask film has a notch and at least one hole. The notch of the mask film corresponds to the notch of the substrate, and the holes of the mask film are arranged close to the upper rim of the substrate.

The memory is provided on the substrate, close to the golden fingers, and further connected to the electrical circuit. In addition, the LEDs are provided on the substrate and connected to the electrical circuit, particularly, each LED configured at the corresponding hoe of the mask film. Thus, light generated by the light emitting diodes passes through the hole and travels outwards along the upper rim of the substrate to form a specific bright pattern, text or strip, which exhibits variation of brightness for the overall memory module, improves and enhances a sense of vision.

Alternatively, the above mask film is provided with at least one hollow mark formed by etching, for instance, and without any hole. At this time, the LEDs are provided on the substrate and specifically at different side from the mask film. For example, the mask film is the front side of the substrate and the LEDs are at the back side such that the light generated by the LEDs is incident onto the hollow marks of the mask film to display the desired pattern.

Another objective of the present invention is to provide a method of manufacturing the memory module. First, a copper foil attached on a substrate with at least partial transparency and good electrical insulation is etched to form electrical circuit and the golden fingers. The golden fingers are configured to insert into a slot of an external device, and connected to the electrical circuit. Further, an upper rim of the substrate has a notch. Next, a mask film is prepared, wherein the mask film is opaque and has a notch and at least one hole close to the notch.

Then, the mask film is attached to the substrate such that the mask film is close to the upper rim of the substrate, and the notch of the mask film corresponds to the notch of the substrate. At least one memory is provided on the substrate and configured close to the golden fingers, particularly connected to the electrical circuit. Finally, at least one LED is provided at the corresponding hole of the mask film. The least one LED is configured to generate and emit light by receiving power from the external device through the golden fingers, or alternatively, by receiving power from an electronic element connected to the electrical circuit on the substrate.

The above mask film is preferably provided at least one hollow mark and dose not have any hole. Particularly, the LEDs are provided on the substrate and specifically at different side from the mask film such that the light generated by the LEDs is incident onto the hollow marks of the mask film to display the desired pattern.

Since the overall structure of the present invention is simple, and the mask film is opaque and has the holes or the hollow marks, the LEDs provided at the corresponding holes may emit the desired light through the holes, or generate light incident onto the hollow marks. As a result, a specific bright pattern, text or strip is shown to exhibit variation of brightness for the overall memory module, thereby enhancing a sense of vision.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention and, together with the description, serve to explain the principles of the invention.

Figure 1:
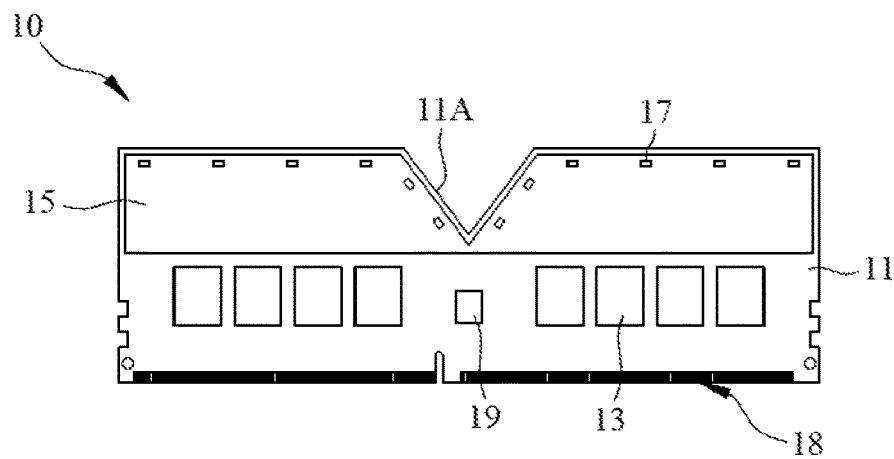
FIG. 1 is a view showing the memory module according to the first embodiment of the present invention.

Please refer to FIG. 1 illustrating the memory module according to the first embodiment of the present invention. As shown in FIG. 1, the memory module 10 of the first embodiment generally comprises a substrate 11, at least one memory 13, a mask film 15 and at least one light emitting diode (LED) 17. The substrate 11 is at least partially transparent, possesses electrical insulation and comprises electrical circuit (not shown). The mask film 15 is opaque, preferably formed of copper foil by the etching process, and provided on the substrate 11 and close to the upper rim of the substrate 11. The at least one memory 13 and the at least one LED 17 are configured on the substrate 11 and connected to the electrical circuit.

Specifically, a notch 11A like V-shape notch is provided at the upper rim of the substrate 11, and the mask film 15 also has a notch corresponding to the notch 11A. It is preferred that the mask film 15 does not completely cover the upper rim of the substrate 11 such that the upper rim of the substrate 11 has a boundary region with a preset width exposed. However, the above aspect of the mask film 15 is not intended to limit the scope of the present invention. Thus, another option is that the mask film 15 covers the whole upper rim of the substrate 11.

In addition, golden fingers 18 are provided at the lower rim of the substrate 11 and connected to the electrical circuit. The golden fingers 18 are configured to insert into the slot of the external device to form electrical connection. The at least one memory 13 is provided on the substrate 11 and close to the golden fingers 18, and separated from the mask film 15.

More specifically, the mask film 15 has at least one hole, which is provided and arranged close to the upper rim of the substrate 11, and each LED 17 is configured at the corresponding hole. For example, the hole is arranged along the V-shape notch to form a V-shape, and the at least one memory 13 is provided on the same side or on two opposite sides of the substrate 11, that is, the front and back sides. Thus, light emitted by the LED 17 passes through the at least one hole and travels outwards to form a specific pattern, text or strip line/curve along the upper rim of the substrate 11, which exhibits variation of brightness for the overall memory module 10, improves and enhances a sense of vision.

Further, the least one LED 17 is configured to generate and emit light by receiving power from the external device (not shown) through the golden fingers 18, or alternatively, by receiving power from an electronic element 19 connected to the electrical circuit on the substrate 11, wherein the electronic element 19 can be implemented by electronic switch or controller.

Figure 2:
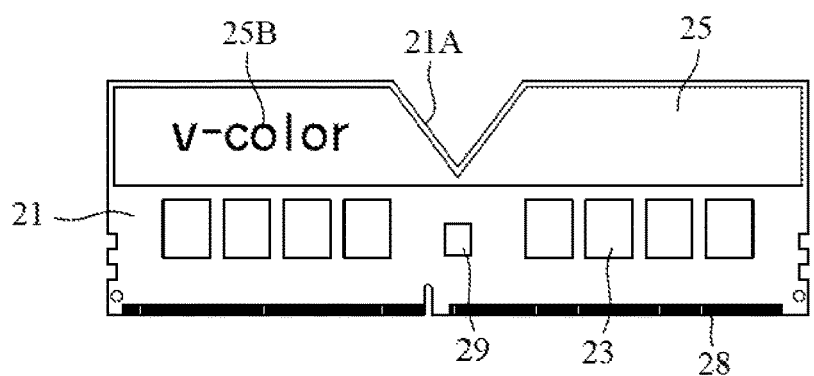
FIG. 2 is a front view showing the memory module according to the second embodiment of the present invention.
Figure 3:
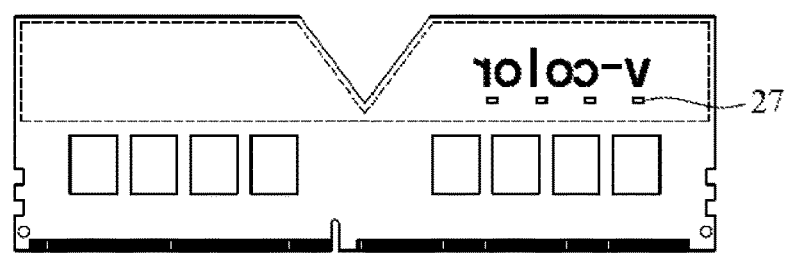
FIG. 3 is a rear view showing the memory module according to the second embodiment of the present invention.

Further refer to FIGS. 2 and 3 showing the front and back sides of the memory module according to the second embodiment of the present invention, respectively. As shown in FIGS. 2 and 3, the memory module 20 of the second embodiment is similar to the above memory module 10 of the first embodiment and comprises a substrate 21, at least one memory 23, a mask film 25 and at least one LED 27. The substrate 21 is at least partially transparent, possesses electrical insulation and comprises electrical circuit (not shown). The mask film 25 is opaque and preferably formed of copper foil. In particular, the mask film 25 is provided on the front side and close to the upper rim of the substrate 21. The memory 23 is configured on the substrate 21 and connected to the electrical circuit, and the LED 27 is specifically configured on the back side of the substrate 21 and further connected to the electrical circuit. In a nutshell, the mask film 25 and the LED 27 are configured on two opposite sides of the substrate 21, respectively.

Additionally, a notch 21A is provided at the upper rim of the substrate 21, and the mask film 15 has a notch corresponding to the notch 21A. Particularly, the mask film 25 has at least one hollow mark 25B, which is implemented by a pattern, text or strip line/curve, like a text "V-color" shown in FIGS. 2 and 3 as an example for clearly describing the aspects of the present invention. It should be noted that the above example is illustrative and not intended to limit the scope of the present invention. Obviously, one primary difference between the first and second embodiments is that the mask film 25 of the second embodiment is provided with the at least one hollow mark 25B instead of the hole in the mask film 15 of the first embodiment such that the light generated by the LED 27 is incident onto the hollow mark 25B of the mask film 25 to display the desired pattern. Since the mask film 25 and the LED 27 of the second embodiment are respectively arranged on different sides of the substrate 21, like the front and back sides, and the other features of the second embodiment are the same as the first embodiment, detailed description for the same components is omitted hereinafter.

To further improve the sense of vision for the hollow mark 25B, the at least one LED 27 is arranged close to the lower rim of the hollow mark 25B such that the light emitted by the LED 17 is upwards incident onto the hollow mark 25B.

Figure 4:
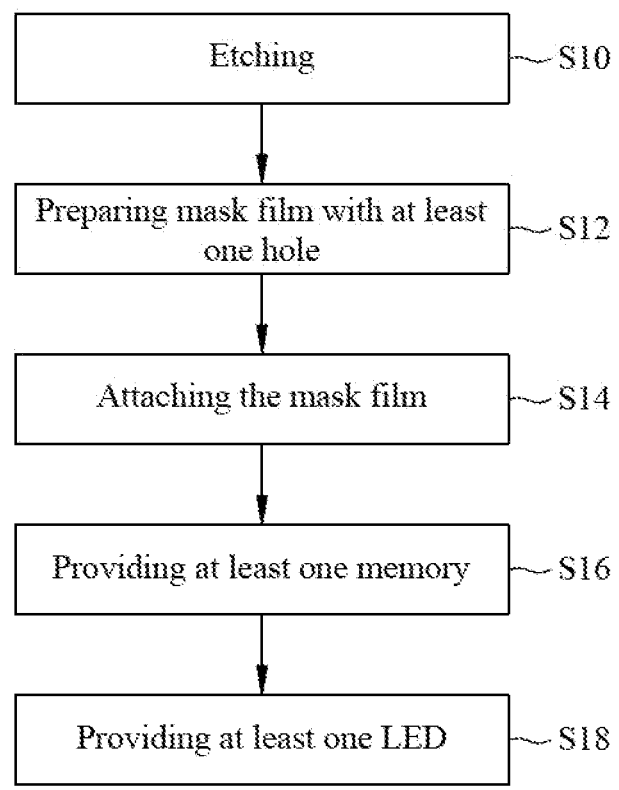
FIG. 4 is a flowchart showing the method of manufacturing the memory module according to the third embodiment of the present invention.

Further refer to FIG. 4 showing a flowchart of the method of manufacturing the memory module according to the third embodiment of the present invention. The method of the third embodiment generally comprises the steps S10, S12, S14, S16 and S18 for manufacturing the memory module 10 as shown in FIG. 1.

Specifically, in the step S10 of the method of the third embodiment, a copper foil provided on a substrate with at least partial transparency and good electrical insulation is processed by etching to form electrical circuit and golden fingers. The golden fingers are intended for inserting into a slot of an external device and further connected to the electrical circuit. In particular, the upper rim of the substrate is provided with a notch like V-shape notch.

Next, the step S12 is performed by preparing an opaque mask film, which is preferably formed of another copper foil and has a notch and at least one hole by another etching process. The at least one hole is specifically provided close to the notch and preferably arranged along the notch of the mask film. The step S14 is then performed. The mask film is attached to the substrate and configured close to the upper rim of the substrate such that the notch of the mask film corresponds to the notch of the substrate. The upper rim of the substrate is preferably not completely covered by the mask film sp as to expose a specific region with a preset width in the upper rim of the substrate. Alternatively, the upper rim of the substrate can completely cover the upper rim of the substrate to meet the actual application.

In the step S16, at least one memory is provided on the substrate, close to the golden fingers, and connected to the electrical circuit. The at least one memory can be arranged on the same side or two opposite sides of the substrate, that is, the front and back sides. Finally, the step S18 is performed by providing at least one LED on the substrate, and particularly, each LED is configured at the corresponding of the hole of the mask film. The least one LED is configured to receive power from the external device through the golden fingers, or alternatively, receive power from an electronic element connected to the electrical circuit on the substrate, so as to generate and emit light.

Figure 5:
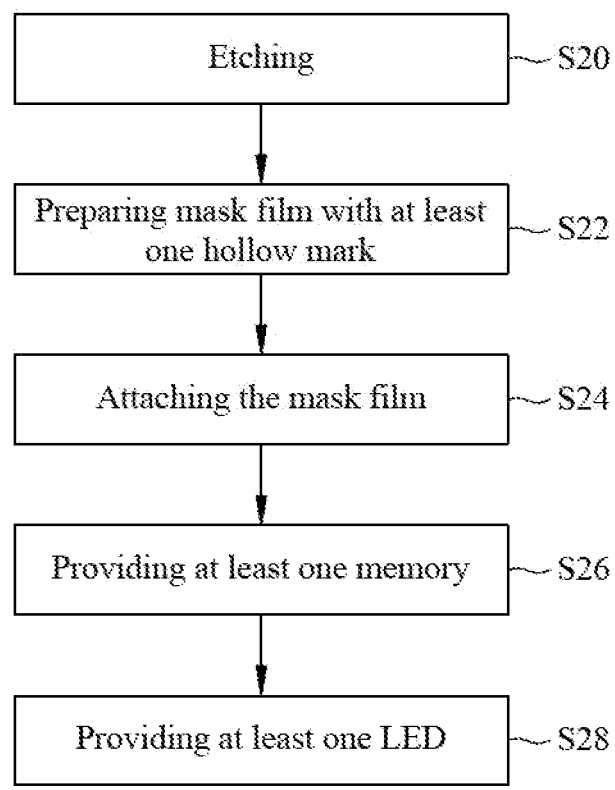
FIG. 5 is a flowchart showing the method of manufacturing the memory module according to the fourth embodiment of the present invention.

Furthermore, refer to FIG. 5 illustrating a flowchart of the method of manufacturing the memory module according to the fourth embodiment of the present invention. The method of the fourth embodiment is similar to the above method of the third embodiment and comprises the steps S20, S22, S24, S26 and S28 for manufacturing the memory module 20, which similarly correspond to the steps S10, S12, S14, S16 and S18 of the third embodiment. One difference between the third and fourth embodiments is that the mask film prepared in the step S22 and the arrangement of the at least one LED in the step S28 are different from those in the steps S12 and S18, respectively. Thus, only the step S22 and S28 are described and the other steps are omitted hereinafter.

In the step S22, the mask film is prepared, and provided with a notch and at least one hollow mark by etching, for instance. The notch of the mask film corresponds to the notch of the substrate, and the at least one hollow mark can be implemented by a pattern, text or strip line/curve. Further, at least one LED is provided on the substrate and connected to the electrical circuit in the step S28. The at least one LED and the mask film are configured on two different sides of the substrate. For example, the mask film is on the front side and the at least one LED is on the back side. As a result, the light emitted by the at least one LED is incident onto the at least one hollow mark to display the desired pattern.

The at least one LED can be further configured close to the lower rim of the at least one hollow mark such that the light emitted by the at least one LED is upwards incident onto the at least one hollow mark to to greatly improve the display effect.

From the above mention, one primary feature of the present invention is that no optical guide or mask element is needed, and the mask film is employed to exhibit the mask effect for light. Particular, the substrate with the notch is attached by the mask film, which is opaque and provided with the at least one hole or hollow mark, and the at least one LED is configured at the at least one hole such that the light generated by the LED passes through the hole or is incident onto the hollow mark to display the bright pattern, text or strip line/curve, and further exhibit variation of brightness for the overall memory module, thereby enhancing a sense of vision. Thus, the overall structure of the present invention is simple and easily to manufacture and assemble so as to solve the problem in the prior arts that human eyes are possibly dazzled or even hurt by the light from the LED, and the sense of vision is strongly enhanced.

Another feature of the present invention is that the mask film is formed of the copper foil and the hole or the hollow mark is manufactured through the conventional etching process without developing any other specific process, and the advantage of high reliability and industrial utility of the present invention is thus achieved.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A memory module, comprising:
   a substrate being at least partially transparent, possessing electrical insulation and comprising electrical circuit, a V-shape notch provided at an upper rim of the substrate, golden finger provided at a lower rim of the substrate and connected to the electrical circuit for inserting into a slot of an external device;
   a mask film being opaque, provided on the substrate and close to the upper rim, having a notch and at least one hole, the notch of the mask film corresponding to the V-shape notch of the substrate, the at least one hole arranged close to the upper rim of the substrate;
   at least one memory provided on the substrate, configured close to the golden fingers, and connected to the electrical circuit; and
   at least one light emitting diode provided on the substrate and connected to the electrical circuit, each light emitting diode configured at the corresponding hole of the mask film,
   wherein the least one LED is configured to generate and emit light by receiving power from the external device through the golden fingers, or alternatively, by receiving power from an electronic element connected to the electrical circuit on the substrate.

2. The memory module as claimed in claim 1, wherein the mask film is formed of a copper foil, the at least one hole of the mask film is arranged along the V-shape notch, and the at least one memory is configured at a side surface of the substrate or at two opposite side surfaces of the substrate.

3. The memory module as claimed in claim 1, wherein the mask film does not completely cover the upper rim of the substrate such that the upper rim of the substrate has a boundary region with a preset width exposed.

4. A memory module, comprising:
    a substrate being at least partially transparent, possessing electrical insulation and comprising electrical circuit, a V-shape notch provided at an upper rim of the substrate, golden finger provided at a lower rim of the substrate and connected to the electrical circuit for inserting into a slot of an external device;
    a mask film being opaque, provided on the substrate and close to the upper rim, having a notch and at least one hollow mark, the notch of the mask film corresponding to the V-shape notch of the substrate;
    at least one memory provided on the substrate, configured close to the golden fingers, and connected to the electrical circuit; and
    at least one light emitting diode provided on the substrate and connected to the electrical circuit, each light emitting diode configured at the corresponding hole of the mask film,
    wherein the least one LED is configured to generate and emit light by receiving power from the external device through the golden fingers, or alternatively, by receiving power from an electronic element connected to the electrical circuit on the substrate such that the light from the least one LED is incident onto the hollow mark of the at least one mask film.

5. The memory module as claimed in claim 4, wherein the mask film is formed of a copper foil, the at least one hole of the mask film is arranged along the V-shape notch, and the at least one memory is configured at a side surface of the substrate or at two opposite side surfaces of the substrate.

6. The memory module as claimed in claim 4, wherein the mask film does not completely cover the upper rim of the substrate such that the upper rim of the substrate has a boundary region with a preset width exposed, and the at least one light emitting diode is configured close to a low rim of the substrate with respect to the at least one hollow mark.

7. A method of manufacturing memory module, comprising:
    performing a etching process on a copper foil provided on a substrate such that the copper foil forms electrical circuit and golden fingers, the golden finger connected to the electrical circuit for inserting into a slot of an external device, a V-shape notch provided at an upper rim of the substrate;
    preparing a mask film formed of a copper foil and being opaque, another etching process performed on the copper foil to form a notch and at least one hole close to the notch;
    attaching the mask film to the substrate, the mask film configured close to an upper rim of the substrate such that the notch of the mask film corresponds to the V-shape notch of the substrate;
    providing at least one memory on the substrate, the at least one memory close to the golden fingers and connected to the electrical circuit; and
    providing at least one light emitting diode at the at least one hole of the mask film,
    wherein the least one LED is configured to generate and emit light by receiving power from the external device through the golden fingers, or alternatively, by receiving power from an electronic element connected to the electrical circuit on the substrate.

8. The method as claimed in claim 7, the at least one hole of the mask film is arranged along the V-shape notch, the at least one memory is configured at a side surface of the substrate or at two opposite side surfaces of the substrate, and the mask film does not completely cover the upper rim of the substrate such that the upper rim of the substrate has a boundary region with a preset width exposed.

9. A method of manufacturing memory module, comprising:
    performing a etching process on a copper foil provided on a substrate such that the copper foil forms electrical circuit and golden fingers, the golden finger connected to the electrical circuit for inserting into a slot of an external device, a V-shape notch provided at an upper rim of the substrate;
    preparing a mask film formed of a copper foil and being opaque, another etching process performed on the copper foil to form a notch and at least one hollow mark;
    attaching the mask film to the substrate, the mask film configured close to an upper rim of the substrate such that the notch of the mask film corresponds to the V-shape notch of the substrate;
    providing at least one memory on the substrate, the at least one memory close to the golden fingers and connected to the electrical circuit; and
    providing at least one light emitting diode on the substrate, the at least one light emitting diode connected to the electrical circuit and configured at a side surface of the substrate different from an opposite side surfaces of the substrate provided with the mask film,
    wherein the least one LED is configured to generate and emit light by receiving power from the external device through the golden fingers, or alternatively, by receiving power from an electronic element connected to the electrical circuit on the substrate.

10. The method as claimed in claim 9, wherein the at least one hole of the mask film is arranged along the V-shape notch, the at least one memory is configured at a side surface of the substrate or at two opposite side surfaces of the substrate, and the mask film does not completely cover the upper rim of the substrate such that the upper rim of the substrate has a boundary region with a preset width exposed, and the at least one light emitting diode is configured close to a low rim of the substrate with respect to the at least one hollow mark.

* * * * *